US011834595B2

(12) United States Patent
Zhang

(10) Patent No.: US 11,834,595 B2
(45) Date of Patent: Dec. 5, 2023

(54) QUANTUM DOT FILM, DISPLAY PANEL AND METHOD FOR MANUFACTURING THE SAME

(71) Applicant: BOE TECHNOLOGY GROUP CO., LTD., Beijing (CN)

(72) Inventor: Xiaoyuan Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 291 days.

(21) Appl. No.: 17/352,478

(22) Filed: Jun. 21, 2021

(65) Prior Publication Data
US 2022/0127527 A1 Apr. 28, 2022

(30) Foreign Application Priority Data

Oct. 23, 2020 (CN) .......................... 202011152310.7

(51) Int. Cl.
C09K 11/56 (2006.01)
C01B 19/04 (2006.01)
C01G 9/08 (2006.01)
B82Y 20/00 (2011.01)
B82Y 30/00 (2011.01)
B82Y 40/00 (2011.01)
H10K 50/15 (2023.01)
H10K 50/16 (2023.01)
H10K 50/17 (2023.01)
H10K 50/115 (2023.01)

(52) U.S. Cl.
CPC ............ C09K 11/565 (2013.01); C01B 19/04 (2013.01); C01G 9/08 (2013.01); B82Y 20/00 (2013.01); B82Y 30/00 (2013.01); B82Y 40/00 (2013.01); H10K 50/115 (2023.02); H10K 50/15 (2023.02); H10K 50/16 (2023.02); H10K 50/17 (2023.02)

(58) Field of Classification Search
CPC .................................................... C09K 11/565
See application file for complete search history.

(56) References Cited

FOREIGN PATENT DOCUMENTS

CN 109609114 A * 4/2019 ........... C09K 11/025

* cited by examiner

Primary Examiner — Joseph L Williams
(74) Attorney, Agent, or Firm — HOUTTEMAN LAW LLC

(57) ABSTRACT

A method for manufacturing a quantum dot film is provided. A substrate plate is provided. A plurality of quantum dot material layers capable of emitting light having different colors are sequentially formed on the substrate plate, wherein at least one of the quantum dot material layers includes a plurality of quantum dots. A local crosslinking process is performed on at least one of the quantum dot material layers, so as to crosslink the crosslinkable ligands in a region emitting light having a corresponding color in the quantum dot material layer. A fluorescence quenching process is performed on the quantum dot material layer subjected to the local crosslinking process, so as to quench the fluorescence of quantum dots outside the region emitting light having the corresponding color in the quantum dot material layer. A display panel and a method for manufacturing the same are also provided.

20 Claims, 7 Drawing Sheets

QUANTUM DOT FILM, DISPLAY PANEL AND METHOD FOR MANUFACTURING THE SAME

TECHNICAL FIELD

The present disclosure relates to the field of display technologies, and particularly relates to a quantum dot film for light emission, a method for manufacturing the quantum dot film, a display panel, and a method for manufacturing the display panel.

BACKGROUND ART

The colloidal quantum dots have great potential in high color quality display due to characteristics of high quantum efficiency, narrow excitation spectrum, unique size for luminescence spectrum and good solution processing compatibility.

Currently, one implementation of quantum dot materials in the display field is to use quantum dot materials to form a light emitting film layer of a light emitting diode in a pixel unit.

Inkjet printing is the commonly used method for preparing the quantum dot light emitting film in the display panel, however, the cost is high for the inkjet printing equipment, and the resolution of the display panel is generally below 350 ppi (Pixel Per inch) due to low precision of an inkjet printing equipment.

SUMMARY

One aspect of the present disclosure provides a method for manufacturing a quantum dot film, the method comprises:

providing a substrate plate;

sequentially forming a plurality of quantum dot material layers capable of emitting light having different colors on the substrate plate, wherein at least one of the quantum dot material layers comprises a plurality of quantum dots, and the quantum dot comprises a quantum dot body and a crosslinkable ligand attached to the quantum dot body through a coordinate bond;

performing a local crosslinking process on the at least one of the quantum dot material layers, so as to crosslink the crosslinkable ligands in a region emitting light having a corresponding color in the quantum dot material layer; and performing a fluorescence quenching process on the quantum dot material layer subjected to the local crosslinking process, so as to quench the fluorescence of quantum dots outside the region emitting light having the corresponding color in the quantum dot material layer, wherein projections of regions emitting lights having corresponding colors in each quantum dot material layer on the substrate plate do not overlap with each other.

Optionally, in the step of performing the local crosslinking process on the quantum dot material layer, the crosslinkable ligands form a crosslinked network structure on the surface of the quantum dot body after being crosslinked.

Optionally, the crosslinkable ligand comprises a coordinating group, a carbon chain, and a crosslinkable functional group, with both of the coordinating group and the crosslinkable functional group being covalently attached to the carbon chain, and the coordinating group being attached to the quantum dot body through the coordinate bond.

Optionally, the crosslinkable functional group is a photocrosslinkable functional group; the plurality of colors include a first color, a second color, and a third color; and the step of performing the local crosslinking process on the quantum dot material layer comprises:

providing a mask plate above the quantum dot material layer, wherein the mask plate comprises a light transmitting portion and a light shading portion, with the light transmitting portion facing opposite to a region emitting light having the first color in the quantum dot material layer, and the light shading portion facing opposite to regions emitting lights having the second color and the third color in the quantum dot material layer; and irradiating the mask plate with light, such that the light reaches the region emitting light having the first color through the light transmitting portion to crosslink the crosslinkable ligands in the region emitting light having the first color.

Optionally, the crosslinkable functional group is at least one selected from a double bond, an epoxy group, a carboxyl group, a thiol group, an amino group and a hydroxyl group.

Optionally, the carbon chain has a length of not less than 4 carbon atoms.

Optionally, the carbon chain further comprises a branch chain having 1 to 18 carbon atoms.

Optionally, the step of performing the fluorescence quenching process on the quantum dot material layer subjected to the local crosslinking process comprises:

performing an ion exchange process on the quantum dot material layer subjected to the local crosslinking process by using a solution with metal cations, so as to quench the fluorescence of quantum dots outside the region emitting light having the corresponding color in the quantum dot material layer.

Optionally, the quantum dot body comprises a core-shell structure, and after the step of performing the ion exchange process on the quantum dot material layer subjected to the local crosslinking process by using the solution with metal cations, cations of the quantum dot shell of the quantum dot body are replaced by the metal cations, and/or cations of the quantum dot core of the quantum dot body are replaced by the metal cations.

Optionally, the metal cation is at least one selected from: $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

Optionally, the plurality of quantum dot material layers comprise a quantum dot material layer emitting red light, a quantum dot material layer emitting green light, and a quantum dot material layer emitting blue light, and the method comprises:

forming a first quantum dot material layer emitting red light on the substrate plate;

performing the local crosslinking process on the first quantum dot material layer, so as to crosslink the crosslinkable ligands in a region emitting red light in the first quantum dot material layer;

performing the fluorescence quenching process on the first quantum dot material layer subjected to the local crosslinking process, so as to quench the fluorescence of quantum dots outside the region emitting red light in the first quantum dot material layer, thereby forming a first layer;

forming a second quantum dot material layer emitting green light on the first layer;

performing the local crosslinking process on the second quantum dot material layer, so as to crosslink the crosslinkable ligands in a region emitting green light in the second quantum dot material layer;

performing the fluorescence quenching process on the second quantum dot material layer subjected to the local crosslinking process, so as to quench the fluorescence of quantum dots outside the region emitting green light in the second quantum dot material layer, thereby forming a second layer;

forming a third quantum dot material layer emitting blue light on the second layer;

performing the local crosslinking process on the third quantum dot material layer, so as to crosslink the crosslinkable ligands in a region emitting blue light in the third quantum dot material layer; and performing the fluorescence quenching process on the third quantum dot material layer subjected to the local crosslinking process, so as to quench the fluorescence of quantum dots outside the region emitting blue light in the third quantum dot material layer, thereby forming a third layer.

Another aspect of the present disclosure provides a method for manufacturing a display panel, the method comprising:

providing a substrate plate, wherein a pixel defining layer is formed on the substrate plate, the pixel defining layer defines a plurality of pixel units, and each pixel unit comprises a plurality of sub-pixel units corresponding to different colors;

forming a plurality of light emitting elements capable of emitting lights having a plurality of different colors on the substrate plate with the pixel defining layer, wherein each light emitting element comprises quantum dot material layers, at least one of the quantum dot material layers comprises a plurality of quantum dots, and the quantum dot comprises a quantum dot body and a crosslinkable ligand attached to the quantum dot body through a coordinate bond;

performing a local crosslinking process on the at least one of the quantum dot material layers, so as to crosslink the crosslinkable ligands in the corresponding sub-pixel units in the quantum dot light emitting layer; and performing a fluorescence quenching process on the quantum dot material layer subjected to the local crosslinking process, so as to quench the fluorescence of quantum dots outside the sub-pixel units of corresponding colors in the quantum dot material layer, wherein projections of regions emitting lights having corresponding colors in each quantum dot material layer on the substrate plate do not overlap with each other.

Optionally, the light emitting element is disposed in correspondence with each of the sub-pixels, and the step of forming the plurality of light emitting elements capable of emitting lights having the plurality of different colors comprises:

sequentially forming a first electrode, an electron transport layer, the quantum dot material layer, a hole transport layer and a second electrode away from the substrate plate.

Yet another aspect of the present disclosure provides a display panel comprising:

a substrate plate;

a pixel defining layer on the substrate plate, wherein the pixel defining layer defines a plurality of pixel units, and each pixel unit comprises a plurality of sub-pixel units corresponding to different colors; and a plurality of light emitting elements capable of emitting lights having a plurality of different colors on the pixel defining layer, wherein each light emitting element comprises quantum dot material layers, and at least one of the quantum dot material layers comprises a light emitting layer in the sub-pixel unit of a corresponding color and an auxiliary layer in the sub-pixel unit corresponding to other color(s), wherein the light emitting layer comprises a quantum dot material with fluorescence, the quantum dot material with fluorescence comprises quantum dot bodies with fluorescence and a crosslinked network structure on the surface of quantum dot bodies, the crosslinked network structure is formed by crosslinking of crosslinkable ligands, the auxiliary layer comprises an auxiliary quantum dot material, and the auxiliary quantum dot material comprises quantum dot bodies with quenched fluorescence and uncrosslinked crosslinkable ligands on the surface of quantum dot bodies with the quenched fluorescence.

Optionally, the quantum dot has a core-shell structure, wherein cations in core material of the quantum dot are the same as or different from cations in shell material of the quantum dot.

Optionally, the core material of the quantum dot and/or the shell material of the quantum dot comprise(s) at least one selected from:

$Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

Optionally, the pixel unit comprises N sub-pixel units, each sub-pixel unit having a light emitting layer and N−1 auxiliary layers, the light emitting layer and the auxiliary layers being stacked in a thickness direction of the display panel, wherein N is an integer greater than 1.

Optionally, each light emitting layer corresponds to N−1 auxiliary layers disposed in the same layer as the light emitting layer.

Optionally, the light emitting element comprises, sequentially away from the substrate plate:

a first electrode;

an electron transport layer;

the light emitting layer;

a hole transport layer; and a second electrode.

Optionally, the sub-pixel units comprise red sub-pixel units, green sub-pixel units, and blue sub-pixel units; and the light emitting layers comprise a red light emitting layer, a green light emitting layer, and a blue light emitting layer, corresponding to the red sub-pixel units, the green sub-pixel units, and the blue sub-pixel units, respectively.

BRIEF DESCRIPTION OF THE DRAWINGS

The accompanying drawings, that constituted a part of the description, are included to provide a further understanding of the present disclosure and illustrate the present disclosure together with the following embodiments, but do not constitute a limitation to the present disclosure. In the drawings.

DETAILED DESCRIPTIONS

The specific embodiments of the present disclosure will be described in detail below with reference to the accompanying drawings. It should be understood that the specific embodiments described herein are given by way of illustration and explanation only, not limitation of the present disclosure.

In the aspect of patterning technology of the quantum dot light emitting device, an inkjet printing method is adopted generally. However, the inkjet printing equipment is expensive, and the printing resolution is generally below 350 ppi. This method is difficult to achieve a higher resolution. Therefore, in order to produce quantum dot light emitting devices on a large scale, it is very important to find novel methods for patterning quantum dot film layers.

Therefore, in order to solve the above problem, one aspect of the present disclosure provides a method for manufacturing a quantum dot film, comprising the steps of: providing a substrate plate; sequentially forming a plurality of quantum dot material layers capable of emitting light having a plurality of different colors on the substrate plate, wherein at least one of the quantum dot material layers comprises a plurality of quantum dots, and the quantum dot comprises a quantum dot body and a crosslinkable ligand attached to the quantum dot body through a coordinate bond; performing a local crosslinking process on the at least one of the quantum dot material layers, so as to crosslink the crosslinkable ligands in a region emitting light having a corresponding color in the quantum dot material layer; and performing a fluorescence quenching process on the quantum dot material layer subjected to the local crosslinking process, so as to quench the fluorescence of quantum dots outside the region emitting the light having the corresponding color in the quantum dot material layer. Optionally, projections of the regions emitting lights having corresponding colors in each quantum dot material layer on the substrate plate do not overlap with each other.

Figure 10:
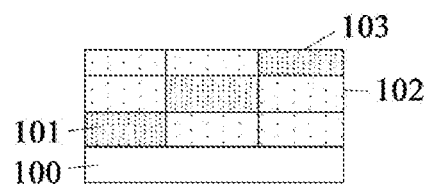
FIG. 10 is a flowchart of the method for manufacturing the quantum dot film according to an embodiment of the present disclosure.
Figure 11:
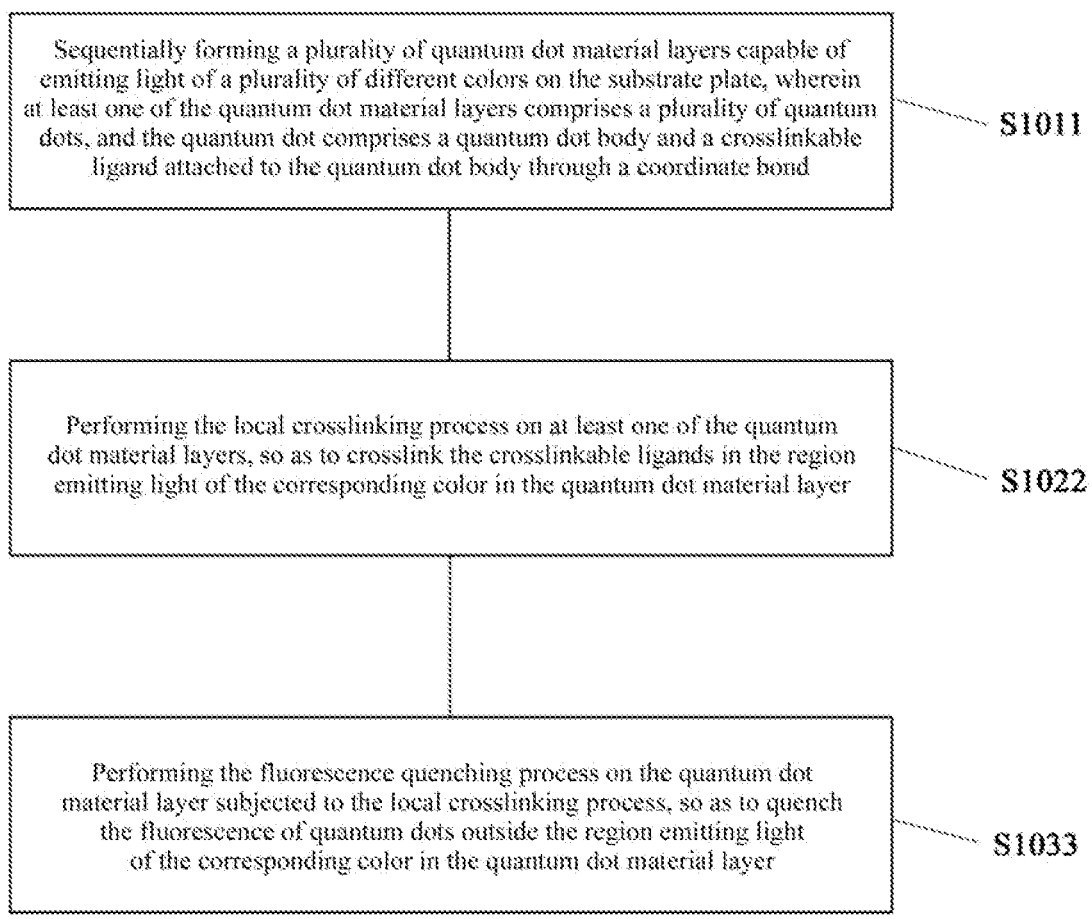
FIG. 11 schematically illustrates a cross-sectional view of the quantum dot film of an embodiment of the present disclosure.

In one embodiment, as shown in FIGS. 10 and 11, the method for manufacturing the quantum dot film comprises: in step S1011, sequentially forming a plurality of quantum dot material layers 101, 102, and 103 capable of emitting light having a plurality of different colors on the substrate plate 100, wherein at least one quantum dot material layer 101 comprises a plurality of quantum dots. The quantum dot material layer 101 may comprise a region that emits a light having a corresponding color (such as red, green, or blue).

The quantum dot comprises a quantum dot body and a crosslinkable ligand attached to the quantum dot body through a coordinate bond. In step S1022, the local crosslinking process is performed on at least one of the quantum dot material layers, so as to crosslink the crosslinkable ligands in the region emitting the light having the corresponding color (such as red, green or blue) in the quantum dot material layer. In step S1033, the fluorescence quenching process is performed on the quantum dot material layer subjected to the local crosslinking process, so as to quench the fluorescence of quantum dots outside the region emitting the light having the corresponding color (i.e., quantum dots in the non-emitting region or the auxiliary region) in the quantum dot material layer.

In one embodiment, the plurality of quantum dot material layers may comprise a quantum dot material layer emitting red light, a quantum dot material layer emitting green light, and a quantum dot material layer emitting blue light, and the manufacturing method comprises:

forming a first quantum dot material layer emitting red light on the substrate plate;

performing the local crosslinking process on the first quantum dot material layer, so as to crosslink the crosslinkable ligands in a region emitting red light in the first quantum dot material layer;

performing the fluorescence quenching process on the first quantum dot material layer subjected to the local crosslinking process, so as to quench the fluorescence of quantum dots outside the region emitting red light in the first quantum dot material layer, thereby forming a first layer;

forming a second quantum dot material layer emitting green light on the first layer;

performing the local crosslinking process on the second quantum dot material layer, so as to crosslink the crosslinkable ligands in a region emitting green light in the second quantum dot material layer;

performing the fluorescence quenching process on the second quantum dot material layer subjected to the local crosslinking process, so as to quench the fluorescence of quantum dots outside the region emitting green light in the second quantum dot material layer, thereby forming a second layer;

forming a third quantum dot material layer emitting blue light on the second layer;

performing the local crosslinking process on the third quantum dot material layer, so as to crosslink the crosslinkable ligands in a region emitting blue light in the third quantum dot material layer; and performing the fluorescence quenching process on the third quantum dot material layer subjected to the local crosslinking process, so as to quench the fluorescence of quantum dots outside the region emitting blue light in the third quantum dot material layer, thereby forming a third layer.

The substrate plate may be a substrate commonly used or commercially available in the art, such as a glass substrate, an ITO substrate, or the like.

The quantum dot may comprise a core-shell quantum dot body and a crosslinkable ligand attached to the quantum dot body through a coordinate bond. The crosslinkable ligand comprises a coordinating group, a carbon chain and a crosslinkable functional group, wherein the coordinating group and the crosslinkable functional group are both covalently attached to the carbon chain, and the coordinating group is attached to the quantum dot body through a coordinate bond. The carbon chain has a length of not less than 4 carbon atoms. The carbon chain may further comprise a branch chain having 1 to 18 carbon atoms. Regarding the coordinating group, it may be selected from groups known in the art, for example, the coordinating group may be an amino group, a carboxyl group, a thiol group, and the like.

In the step of performing the local crosslinking process on the quantum dot material layer, the crosslinkable ligands form a crosslinked network structure on the surface of the quantum dot body after being crosslinked.

The crosslinkable functional group may be a photocrosslinkable functional group, and for example, the crosslinkable functional group may be at least one selected from a double bond, an epoxy group, a carboxyl group, a thiol group, an amino group and a hydroxyl group.

In one embodiment, the plurality of different colors include a first color, a second color, and a third color. The step of performing the local crosslinking process on the quantum dot material layer comprises:

providing a mask plate above the quantum dot material layer, wherein the mask plate comprises a light transmitting portion and a light shading portion, with the light transmitting portion facing opposite to a region emitting light having the first color in the quantum dot material layer, and the light shading portion facing opposite to regions emitting lights having the second color and the third color in the quantum dot material layer; and irradiating the mask plate with light, such that the light reaches the region emitting light having the first color through the light transmitting portion to crosslink the crosslinkable ligands in the region emitting the light having the first color.

In one embodiment, the step of performing the fluorescence quenching process on the quantum dot material layer subjected to the local crosslinking process comprises:

performing an ion exchange process on the quantum dot material layer subjected to the local crosslinking process by using a solution with metal cations so as to quench the fluorescence of quantum dots outside the region emitting the light having the corresponding color in the quantum dot material layer.

After the step of performing the ion exchange process on the quantum dot material layer subjected to the local crosslinking process by using the solution with metal cations, cations of the quantum dot shell of the quantum dot body are replaced by the metal cations, and/or cations of the quantum dot core of the quantum dot body are replaced by the metal cations.

The metal cation may be at least one selected from: $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

As a second aspect of the present disclosure, a method for manufacturing a display panel is provided. The manufacturing method comprises: providing a substrate plate, wherein a pixel defining layer is formed on the substrate plate, the pixel defining layer defines a plurality of pixel units, and each pixel unit comprises a plurality of sub-pixel units corresponding to different colors; forming a plurality of light emitting elements capable of emitting lights having a plurality of different colors on the substrate plate formed with the pixel defining layer, wherein each light emitting element comprises quantum dot material layers, at least one of the quantum dot material layers comprises a plurality of quantum dots, and the quantum dot comprises a quantum dot body and a crosslinkable ligand attached to the quantum dot body through a coordinate bond; performing a local crosslinking process on at least one of the quantum dot material layers, so as to crosslink the crosslinkable ligands in the corresponding sub-pixel units of the quantum dot light emitting layer; and performing a fluorescence quenching process on the quantum dot material layer subjected to the local crosslinking process, so as to quench the fluorescence of quantum dots outside the corresponding sub-pixel units in the quantum dot material layer, wherein the projections of regions emitting lights having corresponding colors in each quantum dot material layer on the substrate plate do not overlap with each other.

The substrate plate, the quantum dot and the crosslinkable ligand are the same as those described above, and thus, are not described in detail.

In one embodiment, the light emitting element may be disposed in correspondence with each of the sub-pixels, and the step of forming the plurality of light emitting elements capable of emitting lights having the plurality of different colors comprises:

sequentially forming a first electrode, an electron transport layer, the quantum dot material layer, a hole transport layer and a second electrode away from the substrate plate.

Figure 1:
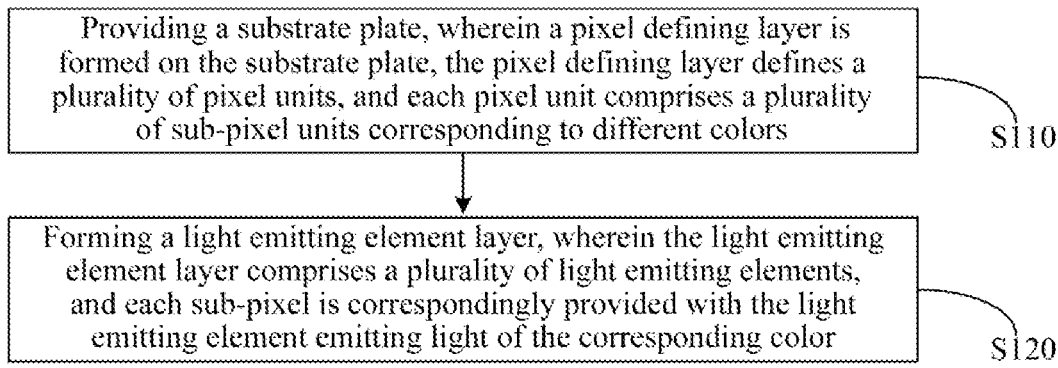
FIG. 1 is a flowchart showing the method for manufacturing the display panel according to an embodiment of the present disclosure.
Figure 2:
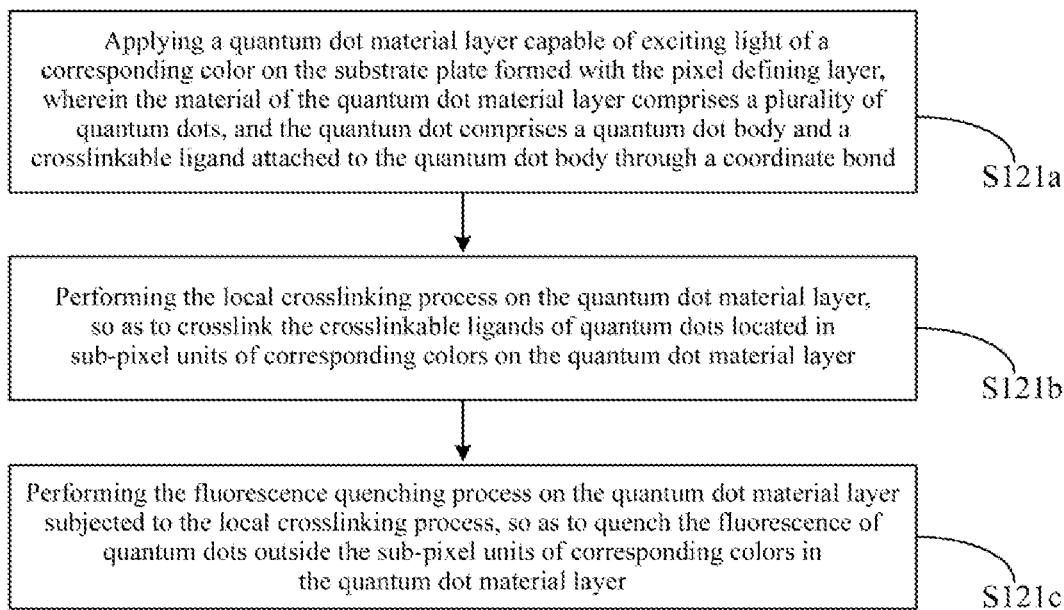
FIG. 2 is a flowchart of forming the light emitting layer in the method for manufacturing the display panel according to an embodiment of the present disclosure.

In one embodiment, as shown in FIG. 1, the method for manufacturing the display panel comprises:

in step S110, providing a substrate plate, wherein a pixel defining layer is formed on the substrate plate, the pixel defining layer defines a plurality of pixel units, and each pixel unit comprises a plurality of sub-pixel units corresponding to different colors;

in step S120, forming a light emitting element layer, wherein the light emitting element layer comprises a plurality of light emitting elements, and each sub-pixel is correspondingly provided with the light emitting element emitting a light having the corresponding color, wherein the step of forming the light emitting element layer comprises:

in step S121, sequentially forming light emitting layers of light emitting elements that emit lights having corresponding colors, and forming the light emitting layer of the light emitting element having at least one color comprises the following steps as shown in FIG. 2:

in step S121a, coating a quantum dot material layer capable of exciting light having a corresponding color on the substrate plate formed with the pixel defining layer, wherein the material of the quantum dot material layer comprises a plurality of quantum dots, and the quantum dot comprises a quantum dot body and a crosslinkable ligand attached to the quantum dot body through a coordinate bond;

in step S121b, performing the local crosslinking process on the quantum dot material layer, so as to crosslink the crosslinkable ligands of quantum dots in sub-pixel units of corresponding colors on the quantum dot material layer;

in step S121c, performing the fluorescence quenching process on the quantum dot material layer subjected to the local crosslinking process, so as to quench the fluorescence of quantum dots outside the sub-pixel units of corresponding colors in the quantum dot material layer.

When forming the light emitting layer of a light emitting element having a certain color, the quantum dot material is firstly applied on the whole surface, and then the quantum dot material at the target position (in the sub-pixel unit of the corresponding color described above) is cured, so that the crosslinkable ligands are crosslinked together on the surface of the quantum dot bodies at the target position. Therefore, in the subsequent step S121c, the fluorescence is quenched in the quantum dot material without the crosslinking of functional groups, and the fluorescence is not affected (i.e., a light having a predetermined wavelength can still be emitted under light excitation) in the quantum dot subjected to crosslinking of ligands (quantum dot coated with resin shell). Via the above the steps S121b and S121c, the quantum dot materials that excite light having desired color may be disposed as a light emitting layer in the corresponding pixel sub-units.

In the manufacturing method provided by the present disclosure, the steps S121b and S121c correspond to a patterning process, without the requirement of inkjet printing, resulting in a low cost. Moreover, without being affected by the precision of the inkjet printing equipment, the product with higher resolution can be obtained by using the manufacturing method provided by the present disclosure.

It should be noted that the "quantum dot body" mentioned in step S121b refers to a core-shell quantum dot having fluorescence. Because the quantum dot body is provided with the crosslinkable ligand, the crosslinkable ligand can form a network structure on the outer surface of the quantum dot body when being crosslinked. The network structure can protect the fluorescence of the quantum dot body from being quenched when performing step S121c.

In the present disclosure, it is not particularly limited on how to perform step S121c, and as an alternative embodiment, step S121c may specifically comprise:
  performing an ion exchange process on the quantum dot material layer subjected to the local crosslinking process by using a solution with metal cations, so as to quench the fluorescence of quantum dots outside the sub-pixel units of corresponding colors in the quantum dot material layer.

In the quantum dot body not being subjected to the ion exchange process, both the material of the quantum dot shell of the quantum dot body and the material of the quantum dot core of the quantum dot body comprise cations. For example, in the case of CdSe/CdS (a red quantum dot capable of emitting red light), the material of the quantum dot core is CdSe with the cation of $Cd^{2+}$, and the material of the quantum dot shell is CdS also with the cation of $Cd^{2+}$. If the cation $Cd^{2+}$ in the quantum dot core and/or quantum dot shell is replaced by other metal cations, the core-shell structure is still obtained after the replacement, but this core-shell structure no longer has fluorescence.

In addition, performing the ion exchange process on the quantum dot material layer subjected to the local crosslinking process by using the solution with metal cations may also beneficial to ensure that the quantum dots which have subjected to crosslinking of functional groups still have good fluorescence. Specifically, since the functional groups of partial quantum dot material are crosslinked and cured to form a network structure in step S121b, cations in the solution cannot penetrate through the network structure, thus ensuring that the quantum dot bodies surrounded by the network structure may not be subjected to ion exchange, and the fluorescence thereof may not be quenched.

Figure 7:
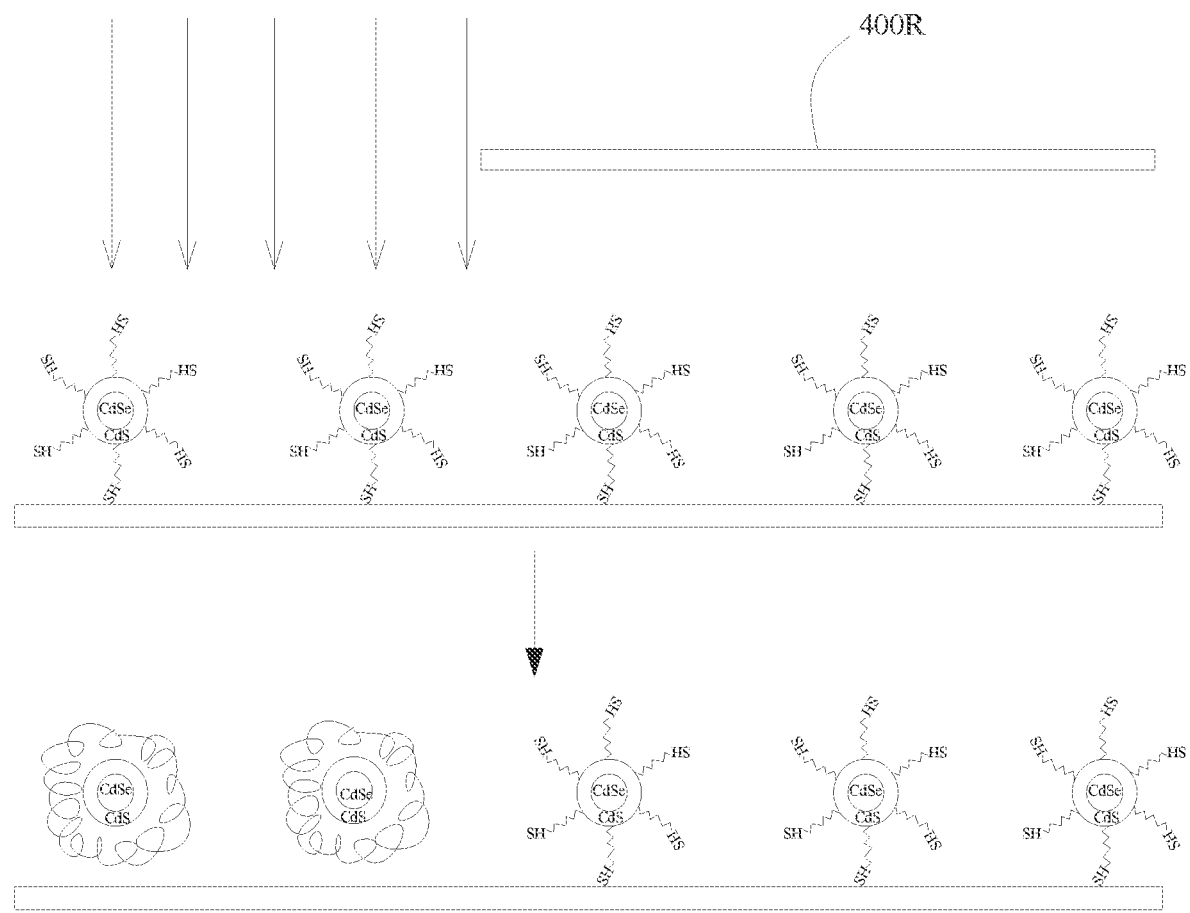
FIG. 7 is a schematic diagram showing a principle of local crosslinking the quantum dot material layer.

In the embodiment shown in FIG. 7, the quantum dot body which has been not subjected to the local curing process and the ion exchange is a CdSe/CdS core-shell quantum dot capable of being excited to emit red light, and the functional group in the crosslinkable ligand being subjected to crosslinking is a thiol group. Performing the curing process on the quantum dot material in the red sub-pixel unit enables crosslinkable ligands to be crosslinked to form a network structure on the surface of the CdSe/CdS core-shell quantum dot body.

Figure 6:
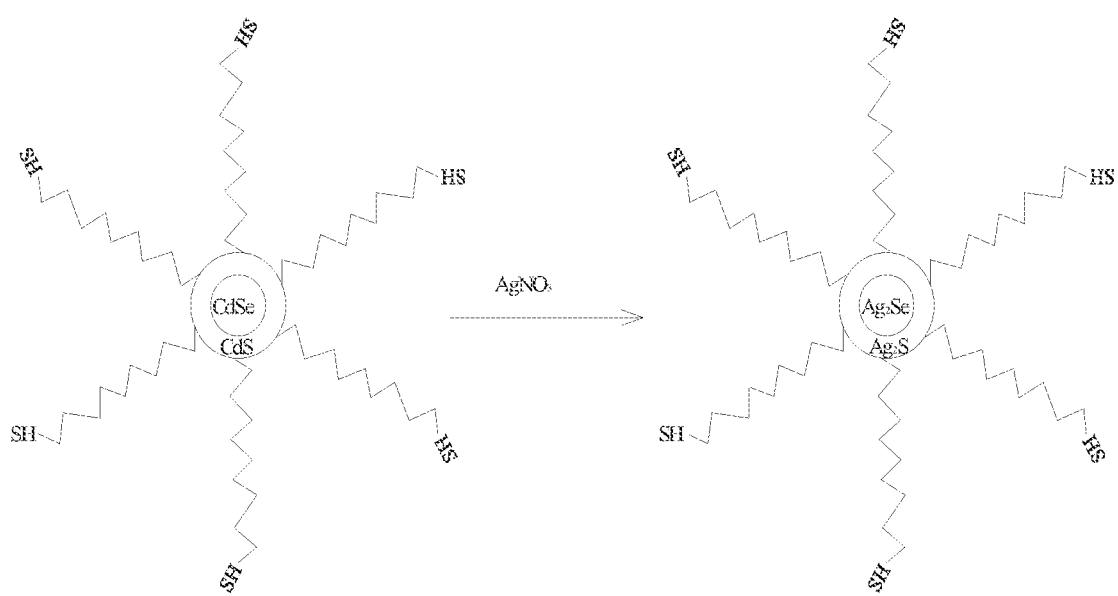
FIG. 6 is a schematic diagram showing the chemical reaction for quenching the fluorescence of quantum dots by ion exchange.
Figure 8:
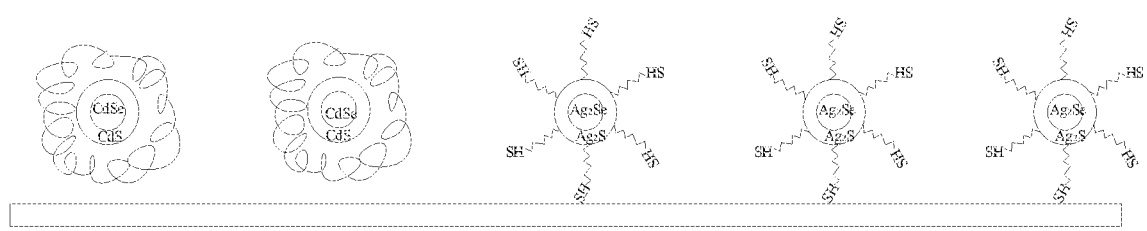
FIG. 8 is a schematic diagram of a principle of performing the ion exchange process on the quantum dot material layer subjected to the local crosslinking process.

After performing the local crosslinking process, cation exchange is performed. As shown in FIGS. 6 and 8, after the cations $Cd^{2+}$ in both of the quantum dot shell and the quantum dot core of the quantum dot body of the quantum dot in which crosslinkable ligands are uncrosslinked are both replaced by $Ag^+$, the $Ag_2Se/Ag_2S$ core-shell structure without fluorescence is obtained. In the step of cation exchange, $Ag^+$ cannot penetrate through the network structure on the surface of the quantum dot with crosslinked crosslinkable ligands, and the quantum dot body can be maintained as CdSe/CdS core-shell structure with fluorescence.

It should be noted that the fluorescence is quenched as long as at least one of the quantum dot core and the quantum dot shell of the quantum dot body is subjected to the ion exchange. In other words, after the step of performing the ion exchange process on the quantum dot material layer subjected to the local crosslinking process by using the solution with metal cations, cations of the quantum dot shell of the quantum dot body are replaced by the metal cations, and/or cations of the quantum dot core of the quantum dot body are replaced by the metal cations.

In the present disclosure, the cation used in step S121c is not particularly limited. For example, the metal cation is at least one selected from:
  $Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

As an alternative embodiment, the solution with metal cations comprises silver nitrate ($AgNO_3$) in methanol FIG. 6 is a reaction diagram showing the fluorescence quenching of the quantum dots by silver ions of silver nitrate in methanol.

FIG. 7 is a schematic diagram of the quantum dot in which the crosslinkable ligands are crosslinked to form a network structure, and it can be seen that the network structure formed by crosslinking of the crosslinkable ligands is located on the outer surface of the quantum dot body.

In the present disclosure, steps S121a to S121c are employed in manufacturing the light emitting layer of the light emitting diode having at least one color. For example, steps S121a to S121c may be employed only in manufacturing the light emitting layer of the light emitting element of one color, or steps S121a to S121c may be employed in manufacturing the light emitting layers of any of the light emitting elements having a plurality of colors.

As an alternative embodiment, the display panel comprises red light emitting diodes emitting red light, blue light emitting diodes emitting blue light, and green light emitting diodes emitting green light. In the embodiment shown in FIG. 4, steps S121a to S121c are employed in manufacturing each of the light emitting layer of the red light emitting diode, the light emitting layer of the blue light emitting diode, and the light emitting layer of the green light emitting diode. Such embodiments will be described in detail below, and will not be described in detail here.

In the present disclosure, it is not particularly limited on how to deal with the quantum dot material after its fluorescence is quenched. The quantum dot material with quenched fluorescence can be removed, or the quantum dot material with quenched fluorescence may not be removed. In order to simplify the manufacturing process, the quantum dot material with quenched fluorescence may not be removed.

Figure 4:
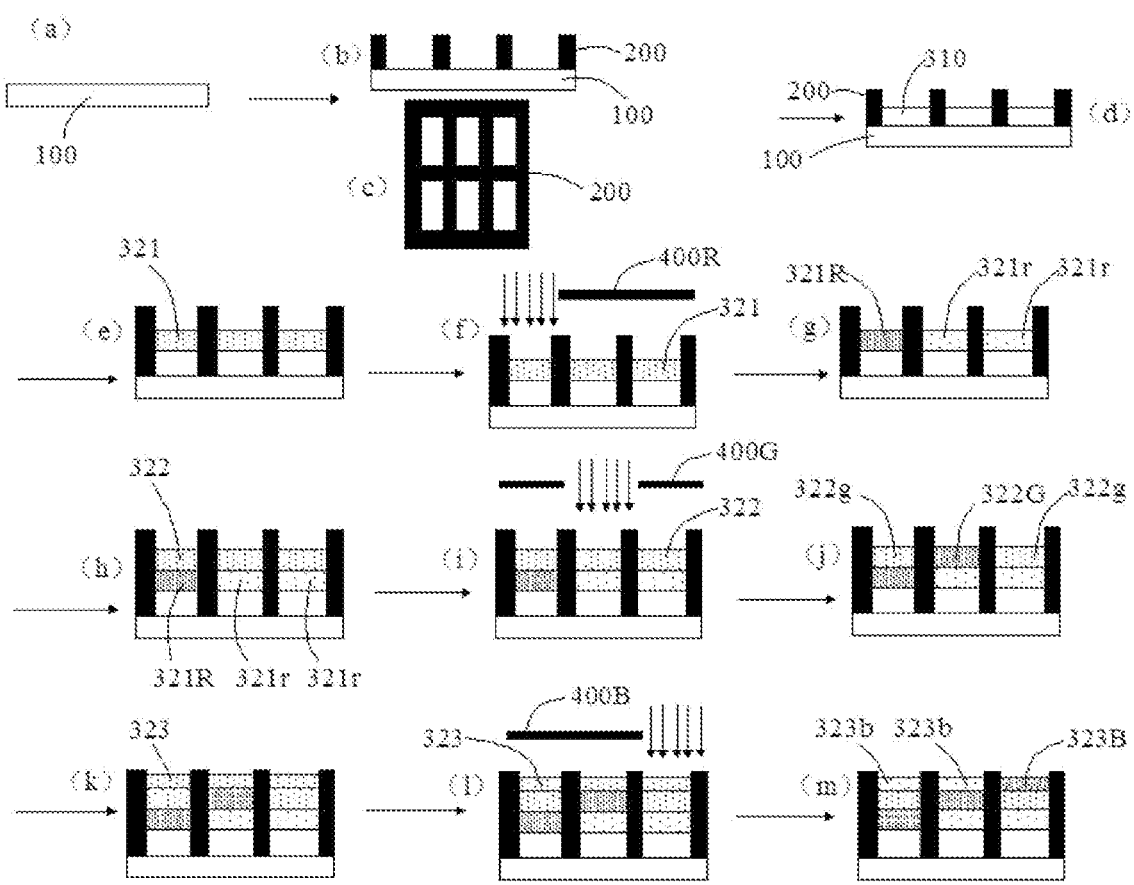
FIG. 4 is a schematic diagram showing various steps in manufacturing the display panel according to an embodiment of the present disclosure.

In the embodiment shown in FIG. 4, the quantum dot material with quenched fluorescence is not removed.

In the present disclosure, the specific structure of the crosslinkable ligand is not particularly limited. Optionally, the crosslinkable ligand comprises a coordinating group, a carbon chain, and a crosslinkable functional group, with both of the coordinating group and the crosslinkable functional group being located on the carbon chain, and the coordinating group being attached to the quantum dot body through a coordinate bond. By virtue of the crosslinking of crosslinkable functional groups, the carbon chains in the crosslinkable ligands can form the network structure.

Figure 9:
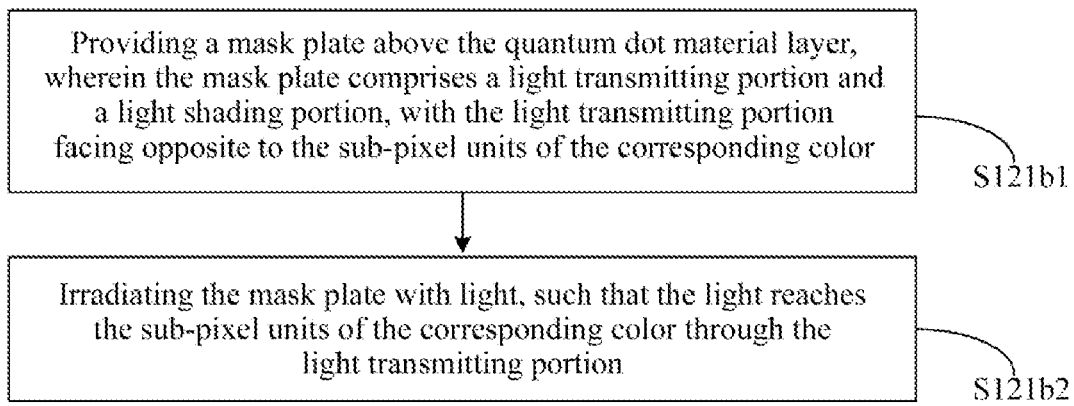
FIG. 9 is a schematic diagram showing an embodiment of step S121b in FIG. 2.

In the present disclosure, it is not particularly limited on how the local crosslinking process is achieved in step S121b. The specific implementation of the local crosslinking process may be determined according to the characteristics of the crosslinkable functional group. In the manufacturing process of the display panel, a photolithography process is mostly used. Thus, in the present disclosure, the crosslinkable functional group is a photocrosslinkable functional group. Accordingly, as shown in FIG. 9, the step S121b of performing the local crosslinking process on the portion in the corresponding sub-pixel unit of the quantum dot material layer may comprise:

in step S121b1, providing a mask plate above the quantum dot material layer, wherein the mask plate comprises a light transmitting portion and a light shading portion, with the light transmitting portion facing opposite to the sub-pixel units of the corresponding color;

in step S1221b2, irradiating the mask plate with light, such that the light reaches the sub-pixel units of the corresponding color through the light transmitting portion.

By irradiating with light, the crosslinkable functional groups on the quantum dots at the corresponding sub-pixels can be crosslinked, thus forming the network structure on the surface of the quantum dot body.

For example, when manufacturing the light emitting layer of the red light emitting diode, the light transmitting portion of the mask plate may face opposite to the position of the red sub-pixel unit, and crosslinkable functional groups of the quantum dot material in the red sub-pixel unit can be crosslinked by irradiating the mask plate with light.

In the present disclosure, the wavelength of the light used in step S121b2 is not particularly limited, and step S121b2 may be performed according to the ligand type of the quantum dot material. When the crosslinkable functional group of the quantum dot material is an ultraviolet curing functional group, the step S121b2 may be performed using ultraviolet light.

In the present disclosure, specific types and specific numbers of the crosslinkable functional groups in a quantum dot are not particularly limited. Optionally, the crosslinkable functional groups comprise at least one of the following functional groups:

a double bond, an epoxy group, a carboxyl group, a thiol group, an amino group and a hydroxyl group.

In the single quantum dot, it can comprise one type of crosslinkable functional group, and alternatively, it can comprise a plurality of types of crosslinkable functional groups.

In order to increase the density of the network structure obtained after the crosslinking of crosslinkable functional groups, the carbon chain optionally has a length of not less than 4 carbon atoms.

Figure 3:
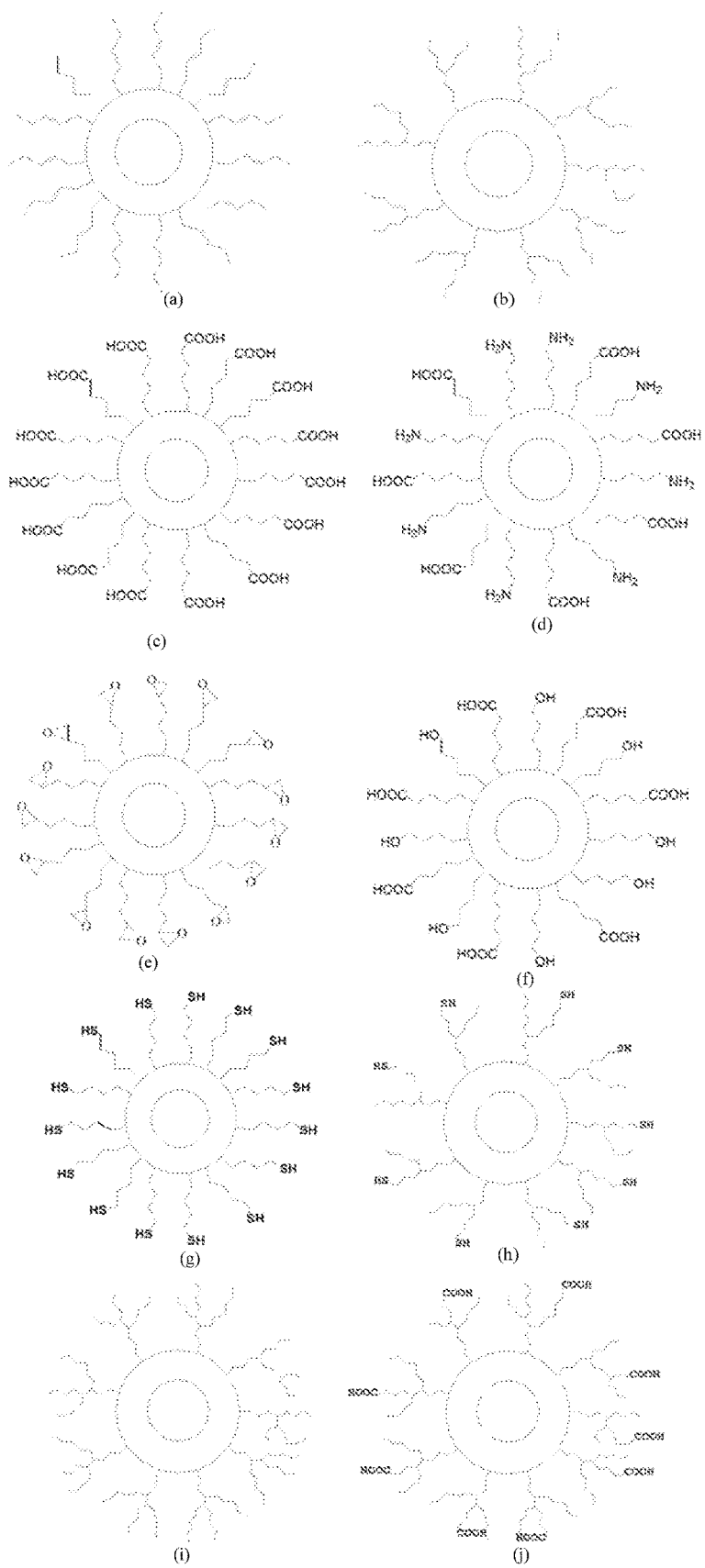
FIG. 3 is a schematic diagram showing various embodiments of core-shell quantum dots.

In order to further increase the density of the network structure obtained after the crosslinking of crosslinkable ligands on the quantum dot bodies, the carbon chain may optionally further comprise branch chain(s). FIGS. 3 (a) to 3 (j) show various embodiments of quantum dots that have not undergone functional group crosslinking (coordinating groups are as described above and not shown in the figures), wherein: in the embodiment shown in FIG. 3 (a), the crosslinkable functional group is a double bond;

in the embodiment shown in FIG. 3 (b), the crosslinkable functional group is a double bond, with one branch chain formed on each carbon chain;

in the embodiment shown in FIG. 3 (c), the crosslinkable functional group is a carboxyl group;

in the embodiment shown in FIG. 3 (d), the crosslinkable functional groups are amino group and carboxyl group;

in the embodiment shown in FIG. 3 (e), the crosslinkable functional group is an epoxy group;

in the embodiment shown in FIG. 3 (f), the crosslinkable functional groups are hydroxyl group and carboxyl group;

in the embodiment shown in FIG. 3 (g), the crosslinkable functional group is a thiol group;

in the embodiment shown in FIG. 3 (h), the crosslinkable functional group is a thiol group, and different from FIG. 3 (g), a branch chain formed on the carbon chain;

in the embodiment shown in FIG. 3 (i), the crosslinkable functional group is a double bond, and different from FIG. 3 (b), two branch chains formed on the carbon chain; and in the embodiment shown in FIG. 3 (j), the crosslinkable functional group is a carboxyl group, and different from FIG. 3 (c), a branch chain formed on the carbon chain.

In the present disclosure, the step S110 of providing the substrate plate is not particularly limited, and optionally, the step S110 may comprise:

providing a driving substrate, wherein a plurality of driving circuits are formed on the driving substrate, and each sub-pixel unit is provided with a corresponding driving circuit;

forming a first electrode layer comprising a first electrode of a plurality of light emitting elements; and forming the pixel defining layer.

The first electrode may be made of a transparent electrode material, and alternatively may be made of a metal material.

In the present disclosure, the light emitting element may be a light emitting diode, and thus the light emitting element may further include a film layer such as an electron transport layer, a hole transport layer, and the like in addition to the first electrode and the light emitting layer, and accordingly, the step S120 of forming the light emitting element layer may further comprise, before the step of sequentially forming the light emitting layers of the light emitting elements emitting lights having various colors:

forming an electron transport layer; and the step S120 of forming the light emitting element layer may further comprise, after the step of sequentially forming the light emitting layers of the light emitting elements emitting lights having the various colors:

forming a hole transport layer on each of the light emitting layers; and forming a second electrode layer.

In the present disclosure, the material of the electron transport layer is not particularly limited. For example, the electron transport layer may be made of zinc oxide (ZnO). However, the present disclosure is not limited thereto, and for example, the electron transport layer may be made of any one of ZnMgO, ZnS, $SnO_2$, and CBP (4,4'-N,N'-dicarbazolyl biphenyl).

One embodiment of the manufacturing method provided by the present disclosure is described in detail below with reference to FIG. 4. Specifically, the manufacturing method comprises:

as shown in FIG. 4 (*a*), providing the substrate plate 100, wherein the substrate plate 100 is a pixelized substrate, that is, the substrate plate 100 comprises a glass substrate, a driving array formed on the glass substrate, and a first electrode layer comprising first electrodes of each light emitting element, with the driving array being used for driving the light emitting elements to emit light;

as shown in FIGS. 4 (*b*) and 4 (*c*), forming the pixel defining layer 200 on the substrate plate 100, wherein FIG. 4 (*b*) is a schematic cross-sectional view showing the substrate plate 100 formed with the pixel defining layer 200, FIG. 4 (*c*) is a schematic top view showing the substrate plate formed with the pixel defining layer 200, and as can be seen from FIG. 4 (*c*), the pixel defining layer 200 defines a plurality of sub-pixel units (including red sub-pixel units, green sub-pixel units, and blue sub-pixel units), wherein after forming the pixel defining layer 200, the substrate plate 100 formed with the pixel defining layer 200 may be washed three times with water, ethanol, and acetone in sequence, and irradiated with ultraviolet ozone for 10 minutes to remove organic residues on the surface;

as shown in FIG. 4 (*d*), forming the electron transport layer 310 on the pixel defining layer 200, wherein the electron transport layer 310 may be made of ZnO, and specifically, ZnO nanoparticles may be deposited and annealed at 120° C. for 10 minutes to form the electron transport layer;

as shown in FIG. 4 (*e*), forming the quantum dot material layer 321 capable of exciting red light on the electron transport layer 310;

as shown in FIG. 4 (*f*), exposing the quantum dot material layer 321 to 365 nm ultraviolet light through the mask plate 400R, such that the crosslinkable functional groups of the quantum dots in the red sub-pixel unit are crosslinked; and as shown in FIG. 4 (*g*), immersing the device describe above in silver nitrate in methanol for 10 minutes, and after being taken out, the surface of the device is washed by methanol to remove excess ions, and by virtue of the ion exchange, the fluorescence of the quantum dot material is quenched in the green sub-pixel unit and the blue sub-pixel unit, finally forming the red light emitting layer 321R and the auxiliary layer 321r, which is in the same layer as the red light emitting layer 321R and is located in the blue sub-pixel unit and the green sub-pixel unit. It is noted that the quantum dots in the auxiliary layer 312r are ion-exchanged quantum dots, and the fluorescence has been quenched. The ultraviolet lamp may be used for irradiating the quantum dot film layer after the ion exchange process is finished. If the unexposed portion of the quantum dot material still has fluorescence, it indicates that the ion exchange reaction is incomplete, and the substrate can be immersed in silver nitrate in methanol until the reaction is complete. Finally, the substrate is taken out, the surface is rinsed, and the quantum dot film layer is annealed on a hot bench at 120° C. for 10 minutes.

A green light emitting layer and a blue light emitting layer are then prepared using a procedure similar to that for preparing the red light emitting layer. Specifically, the method comprises:

as shown in FIG. 4 (*h*), forming the quantum dot material layer 322 capable of exciting green light;

as shown in FIG. 4 (*i*), exposing the quantum dot material layer 322 through the mask plate 400G, such that the crosslinkable functional groups of the quantum dots in the green sub-pixel unit are crosslinked;

as shown in FIG. 4 (*j*), performing the fluorescence quenching on the quantum dot materials in the red sub-pixel unit and the blue sub-pixel unit by ion exchange, finally forming the green light emitting layer 322G and the auxiliary layer 322g, which is in the same layer as the green light emitting layer 322G and is located in the blue sub-pixel unit and the red sub-pixel unit;

as shown in FIG. 4 (*k*), forming the quantum dot material layer 323 capable of exciting blue light;

as shown in FIG. 4 (*l*), exposing the quantum dot material layer 323 through the mask plate 400B, such that the crosslinkable functional groups of the quantum dots in the blue sub-pixel unit are crosslinked;

as shown in FIG. 4 (*m*), performing the fluorescence quenching on the quantum dot materials in the red sub-pixel unit and the green sub-pixel unit by ion exchange, finally forming the blue light emitting layer 323B and the auxiliary layer 323b, which is in the same layer as the blue light emitting layer 323B and is located in the red sub-pixel unit and the green sub-pixel unit;

forming the hole transport layer by depositing on the quantum dot material layer 323; and forming the second electrode by depositing on the hole transport layer.

Figure 5:
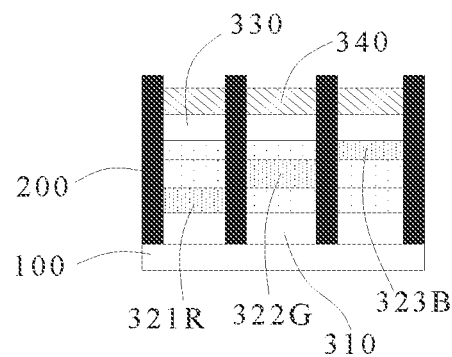
FIG. 5 schematically illustrates a cross-sectional view of the display panel manufactured by the manufacturing method provided by the present disclosure.

The pixel unit of the finally obtained display panel is shown in FIG. 5, and the pixel unit comprises the electron transport layer 200, the red light emitting layer 321R, the green light emitting layer 322G, the blue light emitting layer 323B, the hole transport layer 330 and the second electrode 340 in sequence formed on the substrate plate 100.

In the present disclosure, it is not particularly limited on how to obtain the quantum dot material formed with the crosslinkable ligands. For example, the quantum dot material used in the present disclosure may be obtained by means of precursor synthesis or ligand exchange.

For example, the thermal injection method may be used to prepare CdSe/CdZnSeS/ZnS core-shell quantum dots by the following specific steps:

adding 0.4 mmol of CdO, 6 mmol of zinc acetate and 7 ml of oleic acid into a 50 ml three-necked flask, and purging with nitrogen, followed by heating to 170° C. to dissolve the solid completely;

adding 15 ml of octadecene, followed by heating to 300° C.;

dissolving 0.9 mmol of selenium in 2 ml of trioctylphosphine, adding rapidly into the solution obtained in the second step, and reacting for about 10 minutes;

dissolving 0.1 mmol of selenium and 0.3 mmol of sulfur in 1 ml of trioctylphosphine, adding rapidly into the solution obtained in the third step, and reacting for about 10 minutes; and cooling the solution to room temperature after the reaction is finished, precipitating and washing the quantum dots for three times by acetone, and finally dissolving the quantum dots in octane for later use.

As a third aspect of the present disclosure, a display panel is provided. The display panel comprises a substrate plate; a pixel defining layer on the substrate plate, wherein the pixel defining layer defines a plurality of pixel units, and each pixel unit comprises a plurality of sub-pixel units corresponding to different colors; and a plurality of light emitting elements capable of emitting light having a plurality of different colors on the pixel defining layer, wherein each light emitting element comprises quantum dot material layers, and at least one of the quantum dot material layers comprises a light emitting layer in the sub-pixel unit of a corresponding color and an auxiliary layer in the sub-pixel unit corresponding to other color(s), wherein the light emitting layer comprises a quantum dot material with fluorescence, the quantum dot material with fluorescence comprises quantum dot bodies with fluorescence and a crosslinked network structure on the surface of quantum dot bodies, the crosslinked network structure is formed by crosslinking of crosslinkable ligands, the auxiliary layer comprises an auxiliary quantum dot material, and the auxiliary quantum dot material comprises quantum dot bodies with quenched fluorescence and uncrosslinked crosslinkable ligands on the surface of quantum dot bodies with the quenched fluorescence.

In a specific embodiment, regarding the light emitting element corresponding to light having at least one color, the material of the light emitting layer of the light emitting element is a quantum dot material with fluorescence. The quantum dot material with fluorescence comprises quantum dot bodies with fluorescence and a crosslinked network structure on the surface of quantum dot bodies. The crosslinked network structure is formed by crosslinking of the crosslinkable ligands with each other. The auxiliary layer is formed in the light emitting elements corresponding to lights having other color(s). The material of the auxiliary layer comprises an auxiliary quantum dot material. The auxiliary quantum dot material comprises quantum dot bodies with quenched fluorescence and uncrosslinked crosslinkable ligands on the surface of quantum dot bodies with the quenched fluorescence.

The display panel can be manufactured by the manufacturing method provided by the second aspect of the present disclosure. As described above, the present disclosure provides a manufacturing method that does not require inkjet printing and is low in cost. Moreover, on the premise that the product is not affected by the precision of the inkjet printing equipment, the product with higher resolution can be obtained by using the manufacturing method provided by the present disclosure.

As described above, the fluorescence of the quantum dot body can be quenched by means of ion exchange. During ion exchange, the cations in the quantum dot core of the quantum dot body with fluorescence may be replaced, the cations in the quantum dot shell of the quantum dot body with fluorescence may be replaced, and the cations in both of the quantum dot core and the quantum dot shell of the quantum dot body with fluorescence may be simultaneously replaced.

In other words, the cation in the quantum dot core material of the quantum dot body with quenched fluorescence is the same as or different from the cation in the quantum dot shell material of the quantum dot body with the quenched fluorescence.

As described above, the quantum dot core material of the quantum dot body with quenched fluorescence and/or the quantum dot shell material of the quantum dot body with the quenched fluorescence comprise(s) at least one selected from the following:

$Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

As an alternative embodiment of the present disclosure, the light emitting layer of each sub-pixel unit comprises the quantum dot material, and each sub-pixel unit is disposed with the auxiliary layer. Specifically, the pixel unit comprises N sub-pixel units, and each sub-pixel unit is provided with a light-emitting layer and N-1 auxiliary layers. The light emitting layer and the auxiliary layers are stacked in the thickness direction of the display panel.

Optionally, each light emitting layer corresponds to N-1 auxiliary layers disposed in the same layer as the light emitting layer.

For example, in the case of N=3, the pixel units of the display panel comprise red sub-pixel units, green sub-pixel units, and blue sub-pixel units. As shown in FIG. 5, the pixel unit comprises the electron transport layer 200, the red light emitting layer 321R, the auxiliary layer 321*r* in the same layer as the red light emitting layer 321R, the green light emitting layer 322G, the auxiliary layer 322*g* in the same layer as the green light emitting layer 322G, the blue light emitting layer 323B, the auxiliary layer 323*b* in the same layer as the blue light emitting layer 323B, the hole transport layer 330 and the second electrode 340 formed on the substrate plate 100.

As described above, the crosslinkable ligand may comprise a coordinating group, a carbon chain, and a crosslinkable functional group, with both of the coordinating group and the crosslinkable functional group located on the carbon chain, and the coordinating group being attached to the quantum dot body through a coordinate bond.

As described above, the functional group is a photocurable functional group.

As described above, the functional group may comprise at least one of the following functional groups:

a double bond, an epoxy group, a carboxyl group, a thiol group, an amino group and a hydroxyl group.

In order to increase the density of the network structure obtained after the crosslinking of functional groups, the carbon chain optionally has not less than 4 carbon atoms.

In order to further increase the density of the network structure obtained after crosslinking, the carbon chain may optionally further comprise branch chain(s).

Optionally, the display panel further comprises a substrate plate, on which a pixel defining layer is formed, and the pixel defining layer defines a plurality of pixel units.

Examples

1. Preparation of CdSe/CdZnSeS/ZnS Core-Shell Quantum Dots 0.4 mmol of CdO, 6 mmol of zinc acetate and 7 ml of oleic acid were added into a 50 ml three-necked flask, and purged with nitrogen. The mixture was then heated to 170° C. to dissolve the solid completely.

15 ml of octadecene was added, and then the temperature was raised to 300° C.

0.9 mmol of selenium was dissolved in 2 ml of trioctylphosphine and the solution was added rapidly into the solution obtained in the second step, followed by reacting for about 10 minutes.

0.1 mmol of selenium and 0.3 mmol of sulfur were dissolved in 1 ml of trioctylphosphine and the solution was added rapidly into the solution obtained in the third step, followed by reacting for about 10 minutes.

After the reaction is finished, the solution was cooled to room temperature, and the quantum dots were precipitated and washed for three times by acetone. Finally, the quantum dots were dissolved in octane. Then, the CdSe/CdZnSeS/ZnS core-shell quantum dot containing photocrosslinkable functional groups in the ligand was obtained by ligand exchange, as shown in FIG. 3 (*g*).

2. The pixelized ITO conductive glass substrate was washed three times with water, ethanol, and acetone in sequence, and the substrate was irradiated with ultraviolet ozone for 10 minutes to remove organic residues and the like on the surface.

3. ZnO nanoparticles were deposited on the clean ITO glass substrate and annealed at 120° C. for 10 minutes to form the electron transport layer.

4. The red quantum dot material prepared in the above item 1 was deposited on the electron transport layer formed above, and specific pixels were exposed through the mask plate by using 365 nm ultraviolet light to ensure that the quantum dots at the pixel position were crosslinked and cured.

5. The device obtained in the above item 4 was immersed in 0.1 mol/L silver nitrate in methanol for 10 minutes, taken out and washed by methanol to remove excess ions on the surface. The quantum dot film layer was irradiated by using an ultraviolet lamp. The fluorescence of the unexposed position was evaluated after the ion exchange reaction. If there is fluorescence, it indicates that the exchange reaction is incomplete, and the device was continued to be immersed in silver nitrate in methanol for a period of time. The substrate was taken out after the ion exchange was complete, and washed by methanol to remove excess ions on the surface. Finally, the quantum dot film layer was annealed on a hot bench at 120° C. for 10 minutes.

6. Green quantum dots and blue quantum dots were deposited according to the procedures of the above items 4 and 5, wherein green quantum dots are CdSe/ZnS core-shell quantum dots, and blue quantum dots are ZnSe/ZnS core-shell quantum dots. The formed green and blue pixels were exposed and ion exchanged according to the above method, to obtain the device patterned with red, green and blue colors respectively.

7. The hole transport layer material CBP and the hole injection layer material $MoO_3$ were deposited, and finally Ag was vacuum evaporated as the anode, thereby manufacturing the quantum dot display panel.

It can be understood that the foregoing embodiments are merely illustrative embodiments employed for describing the principle of the present disclosure. However, the present disclosure is not limited thereto. For a skilled person in the art, various variations and modifications can be made without departing from the spirit and essence of the present disclosure. These variations and modifications are regarded as the protection scope of the present disclosure.

The invention claimed is:

1. A method for manufacturing a quantum dot film, comprising:
providing a substrate plate;
sequentially forming a plurality of quantum dot material layers capable of emitting light having different colors on the substrate plate, wherein at least one of the quantum dot material layers comprises a plurality of quantum dots, and the quantum dots comprise a quantum dot body and a crosslinkable ligand attached to the quantum dot body through a coordinate bond;
performing a local crosslinking process on the at least one of the quantum dot material layers, so as to crosslink the crosslinkable ligand in a region emitting a light having a corresponding color in the quantum dot material layer; and
performing a fluorescence quenching process on the quantum dot material layer subjected to the local crosslinking process, so as to quench fluorescence of the quantum dots outside the region emitting the light having the corresponding color in the quantum dot material layer,
wherein projections of the regions emitting the light having the corresponding color in each of the quantum dot material layers on the substrate plate do not overlap with each other.

2. The method of claim 1, wherein in the step of performing the local crosslinking process on the quantum dot material layer, the crosslinkable ligand forms a crosslinked network structure on the surface of the quantum dot body after being crosslinked.

3. The method of claim 1, wherein the crosslinkable ligand comprises a coordinating group, a carbon chain, and a crosslinkable functional group, with both of the coordinating group and the crosslinkable functional group being covalently attached to the carbon chain, and the coordinating group being attached to the quantum dot body through a coordinate bond.

4. The method of claim 3, wherein the crosslinkable functional group is a photocrosslinkable functional group; the different colors include a first color, a second color, and a third color; and the step of performing the local crosslinking process on the quantum dot material layer comprises:
providing a mask plate above the quantum dot material layer, wherein the mask plate comprises a light transmitting portion and a light shading portion, with the light transmitting portion facing opposite to a region emitting the light having the first color in the quantum dot material layer, and the light shading portion facing opposite to regions emitting lights having the second color and the third color in the quantum dot material layer; and
irradiating the mask plate with light, such that the light reaches the region emitting the light having the first color through the light transmitting portion to crosslink the crosslinkable ligand in the region emitting the light having the first color.

5. The method of claim 4, wherein the crosslinkable functional group is at least one selected from a double bond, an epoxy group, a carboxyl group, a thiol group, an amino group and a hydroxyl group.

6. The method of claim 3, wherein the carbon chain has a length of not less than 4 carbon atoms.

7. The method of claim 6, wherein the carbon chain further comprises a branch chain having 1 to 18 carbon atoms.

8. The method of claim 1, wherein the step of performing the fluorescence quenching process on the quantum dot material layer subjected to the local crosslinking process comprises:
performing an ion exchange process on the quantum dot material layer subjected to the local crosslinking process by using a solution with metal cations, so as to quench the fluorescence of quantum dots outside the region emitting the light having the corresponding color in the quantum dot material layer.

9. The method of claim 8, wherein the quantum dot body comprises a core-shell structure, and after the step of performing the ion exchange process on the quantum dot material layer subjected to the local crosslinking process by using the solution with metal cations, cations of the quantum dot shell of the quantum dot body are replaced by the metal cations, and/or cations of the quantum dot core of the quantum dot body are replaced by the metal cations.

10. The method of claim 8, wherein the metal cation is at least one selected from:
$Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

11. The method of claim 1, wherein the plurality of quantum dot material layers comprise a quantum dot material layer emitting red light, a quantum dot material layer emitting green light, and a quantum dot material layer emitting blue light, and the method comprises:
forming a first quantum dot material layer emitting red light on the substrate plate;
performing the local crosslinking process on the first quantum dot material layer, so as to crosslink the crosslinkable ligand in a region emitting red light in the first quantum dot material layer;
performing the fluorescence quenching process on the first quantum dot material layer subjected to the local crosslinking process, so as to quench the fluorescence of quantum dots outside the region emitting red light in the first quantum dot material layer, thereby forming a first layer;
forming a second quantum dot material layer emitting green light on the first layer;
performing the local crosslinking process on the second quantum dot material layer, so as to crosslink the crosslinkable ligands in a region emitting green light in the second quantum dot material layer;
performing the fluorescence quenching process on the second quantum dot material layer subjected to the local crosslinking process, so as to quench the fluorescence of quantum dots outside the region emitting green light in the second quantum dot material layer, thereby forming a second layer;
forming a third quantum dot material layer emitting blue light on the second layer;
performing the local crosslinking process on the third quantum dot material layer, so as to crosslink the crosslinkable ligands in a region emitting blue light in the third quantum dot material layer; and
performing the fluorescence quenching process on the third quantum dot material layer subjected to the local crosslinking process, so as to quench the fluorescence of quantum dots outside the region emitting blue light in the third quantum dot material layer, thereby forming a third layer.

12. A method for manufacturing a display panel, comprising:
providing a substrate plate, wherein a pixel defining layer is formed on the substrate plate, the pixel defining layer defines a plurality of pixel units, and each of pixel units comprises a plurality of sub-pixel units corresponding to different colors;
forming a plurality of light emitting elements capable of emitting a light having a plurality of different colors on the substrate plate formed with the pixel defining layer, wherein each light emitting element comprises quantum dot material layers, at least one of the quantum dot material layers comprises a plurality of quantum dots, and the quantum dot comprises a quantum dot body and a crosslinkable ligand attached to the quantum dot body through a coordinate bond;
performing a local crosslinking process on the at least one of the quantum dot material layers, so as to crosslink the crosslinkable ligand in the sub-pixel unit of corresponding color in the quantum dot material layer; and
performing a fluorescence quenching process on the quantum dot material layer subjected to the local crosslinking process, so as to quench the fluorescence of quantum dots outside the sub-pixel unit of corresponding color in the quantum dot material layer, wherein projections of the regions emitting a light having corresponding colors in each quantum dot material layer on the substrate plate do not overlap with each other.

13. The method of claim 12, wherein the light emitting element is disposed in correspondence with each of the sub-pixels, and the step of forming the plurality of light emitting elements capable of emitting lights having the plurality of different colors comprises:
sequentially forming a first electrode, an electron transport layer, the quantum dot material layer, a hole transport layer and a second electrode away from the substrate plate.

14. A display panel, comprising:
a substrate plate;
a pixel defining layer on the substrate plate, wherein the pixel defining layer defines a plurality of pixel units, and each pixel unit comprises a plurality of sub-pixel units corresponding to different colors; and
a plurality of light emitting elements capable of emitting lights having a plurality of different colors on the pixel defining layer, wherein each of the light emitting elements comprises quantum dot material layers, and at least one of the quantum dot material layers comprises a light emitting layer in the sub-pixel unit of a corresponding color and an auxiliary layer in the sub-pixel unit corresponding to other color(s),
wherein the light emitting layer comprises a quantum dot material with fluorescence, the quantum dot material with fluorescence comprises quantum dot bodies with fluorescence and a crosslinked network structure on the surface of quantum dot bodies, the crosslinked network structure is formed by crosslinking of crosslinkable ligands, and the auxiliary layer comprises an auxiliary quantum dot material, the auxiliary quantum dot material comprises quantum dot bodies with quenched fluorescence and uncrosslinked crosslinkable ligands on the surface of quantum dot bodies with the quenched fluorescence.

15. The display panel of claim 14, wherein the quantum dot has a core-shell structure, wherein cations in core material of the quantum dot are the same as or different from cations in shell material of the quantum dot.

16. The display panel of claim 15, wherein the core material of the quantum dot and/or the shell material of the quantum dot comprise(s) at least one selected from:
$Fe^{3+}$, $Cu^+$, $Co^{2+}$, $Ni^{2+}$, $Ag^+$, $Mo^{6+}$, $Na^+$, $K^+$, $Cs^+$, $Ba^{2+}$, $Ca^{2+}$, $Hg^{2+}$, $Sn^{2+}$, and $Pb^{2+}$.

17. The display panel of claim 14, wherein the pixel unit comprises N sub-pixel units, each sub-pixel unit having a light emitting layer and N−1 auxiliary layers, the light emitting layer and the auxiliary layers being stacked in a thickness direction of the display panel, wherein N is an integer greater than 1.

18. The display panel of claim 17, wherein each of light emitting layers corresponds to N−1 auxiliary layers disposed in the same layer as the light emitting layer.

19. The display panel of claim 14, wherein the light emitting element sequentially comprises, away from the substrate plate:
a first electrode;
an electron transport layer;
the light emitting layer;
a hole transport layer; and
a second electrode.

20. The display panel of claim 14, wherein the sub-pixel units comprise red sub-pixel units, green sub-pixel units, and blue sub-pixel units; and the light emitting layers comprise a red light emitting layer, a green light emitting layer, and a blue light emitting layer corresponding to the red sub-pixel units, the green sub-pixel units, and the blue sub-pixel units, respectively.

\* \* \* \* \*